United States Patent
Then et al.

(10) Patent No.: US 10,700,665 B2
(45) Date of Patent: Jun. 30, 2020

(54) FILM BULK ACOUSTIC RESONATOR (FBAR) DEVICES FOR HIGH FREQUENCY RF FILTERS

(71) Applicant: INTEL CORPORATION, Santa Clara, CA (US)

(72) Inventors: Han Wui Then, Portland, OR (US); Sansaptak Dasgupta, Hillsboro, OR (US); Marko Radosavljevic, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/773,016

(22) PCT Filed: Dec. 4, 2015

(86) PCT No.: PCT/US2015/063976
§ 371 (c)(1),
(2) Date: May 2, 2018

(87) PCT Pub. No.: WO2017/095437
PCT Pub. Date: Jun. 8, 2017

(65) Prior Publication Data
US 2018/0323767 A1    Nov. 8, 2018

(51) Int. Cl.
*H03H 9/13*    (2006.01)
*H03H 9/17*    (2006.01)
(Continued)

(52) U.S. Cl.
CPC .............. *H03H 9/173* (2013.01); *H03H 3/02* (2013.01); *H03H 9/02015* (2013.01);
(Continued)

(58) Field of Classification Search
CPC .......... H03H 9/173; H03H 9/562; H03H 9/13; H03H 9/02; H03H 9/174; H03H 9/02015; H03H 2003/021; H03H 2003/023
See application file for complete search history.

(56) References Cited

U.S. PATENT DOCUMENTS

| | | | | |
|---|---|---|---|---|
| 7,525,653 B1 * | 4/2009 | Hug | ........................ | G01J 3/10 356/301 |
| 2004/0135144 A1 * | 7/2004 | Yamada | ............. | H03H 9/02094 257/59 |

(Continued)

FOREIGN PATENT DOCUMENTS

| WO | 2014012136 A2 | 1/2014 |
|---|---|---|
| WO | 2017095437 A1 | 6/2017 |

OTHER PUBLICATIONS

International Search Report and Written Opinion received for PCT Application No. PCT/US2015/063976, dated Aug. 8, 2016. 14 pages.

(Continued)

*Primary Examiner* — Ahmed N Sefer
(74) *Attorney, Agent, or Firm* — Finch & Maloney PLLC

(57) ABSTRACT

Techniques are disclosed for forming high frequency film bulk acoustic resonator (FBAR) devices using epitaxially grown piezoelectric films. In some cases, the piezoelectric layer of the FBAR may be an epitaxial III-V layer such as an aluminum nitride (AlN) or other group III material-nitride (III-N) compound film grown as a part of a III-V material stack, although any other suitable piezoelectric materials can be used. Use of an epitaxial piezoelectric layer in an FBAR device provides numerous benefits, such as being able to achieve films that are thinner and higher quality compared to sputtered films, for example. The higher quality piezoelectric film results in higher piezoelectric coupling coefficients, which leads to higher Q-factor of RF (Continued)

filters including such FBAR devices. Therefore, the FBAR devices can be included in RF filters to enable filtering high frequencies of greater than 3 GHz, which can be used for 5G wireless standards, for example.

20 Claims, 6 Drawing Sheets

(51) Int. Cl.
    *H03H 3/02* (2006.01)
    *H03H 9/02* (2006.01)
    *H03H 9/56* (2006.01)

(52) U.S. Cl.
    CPC .............. *H03H 9/13* (2013.01); *H03H 9/174* (2013.01); *H03H 9/562* (2013.01); *H03H 2003/021* (2013.01); *H03H 2003/023* (2013.01)

(56) References Cited

U.S. PATENT DOCUMENTS

| | | | |
|---|---|---|---|
| 2005/0127792 A1* | 6/2005 | Mehta | H01H 57/00 310/332 |
| 2005/0189846 A1 | 9/2005 | Saito et al. | |
| 2006/0001508 A1 | 1/2006 | Ohara et al. | |
| 2007/0024395 A1* | 2/2007 | Motai | H03H 3/02 333/189 |
| 2007/0228876 A1* | 10/2007 | Sung | H03H 3/04 310/320 |
| 2008/0169884 A1* | 7/2008 | Matsumoto | H03H 3/04 333/187 |
| 2010/0258835 A1 | 10/2010 | Hsu | |
| 2010/0327701 A1* | 12/2010 | Grannen | H03H 3/04 310/346 |
| 2012/0056507 A1 | 3/2012 | Eggs et al. | |
| 2013/0113577 A1* | 5/2013 | Adkisson | H03H 9/173 333/188 |
| 2013/0176086 A1* | 7/2013 | Bradley | H03H 9/1007 333/189 |
| 2014/0118092 A1* | 5/2014 | Burak | H03H 9/132 333/187 |
| 2015/0256146 A1* | 9/2015 | Hsu | H03H 9/205 333/192 |
| 2017/0025596 A1* | 1/2017 | Qiu | H01P 1/201 |
| 2017/0093361 A1* | 3/2017 | Grosjean | H03H 9/125 |
| 2018/0278236 A1* | 9/2018 | Hurwitz | H03H 9/568 |
| 2019/0199312 A1* | 6/2019 | Dasgupta | H03H 3/02 |
| 2019/0199322 A1* | 6/2019 | Dasgupta | H03H 3/02 |

OTHER PUBLICATIONS

International Preliminary Report on Patentability received for PCT Application No. PCT/US2015/063976, dated Jun. 5, 2018. 10 pages.

TW Office Action received for TW Application No. 1051351109 issued by the Intellectual Property Office (the IPO) dated Nov. 19, 2019, 11 pages.

TW Search Report received for TW Application No. 105135109 dated Nov. 19, 2019, 1 page.

* cited by examiner

FILM BULK ACOUSTIC RESONATOR (FBAR) DEVICES FOR HIGH FREQUENCY RF FILTERS

BACKGROUND

Radio frequency (RF) filters are an important component in modern communication systems. With the growing number of bands and modes of communications, the number of RF filters in a mobile device front end can multiply quickly. Resonators, such as film bulk acoustic resonators (FBAR), sometimes referred to as thin-FBAR (TFBAR), are the components that are used to make RF filters. For example, one RF filter may include up to seven FBAR devices arranged in various configurations (e.g., a half-ladder circuit configuration). An FBAR or TFBAR is a device consisting of a piezoelectric material located between two electrodes and acoustically isolated from the surrounding medium. An example RF front end covering 2G/3G and 4G mobile telecommunications technologies may contain seventeen RF filters, which can result in a total of 119 FBARs, for example.

Figure 1:
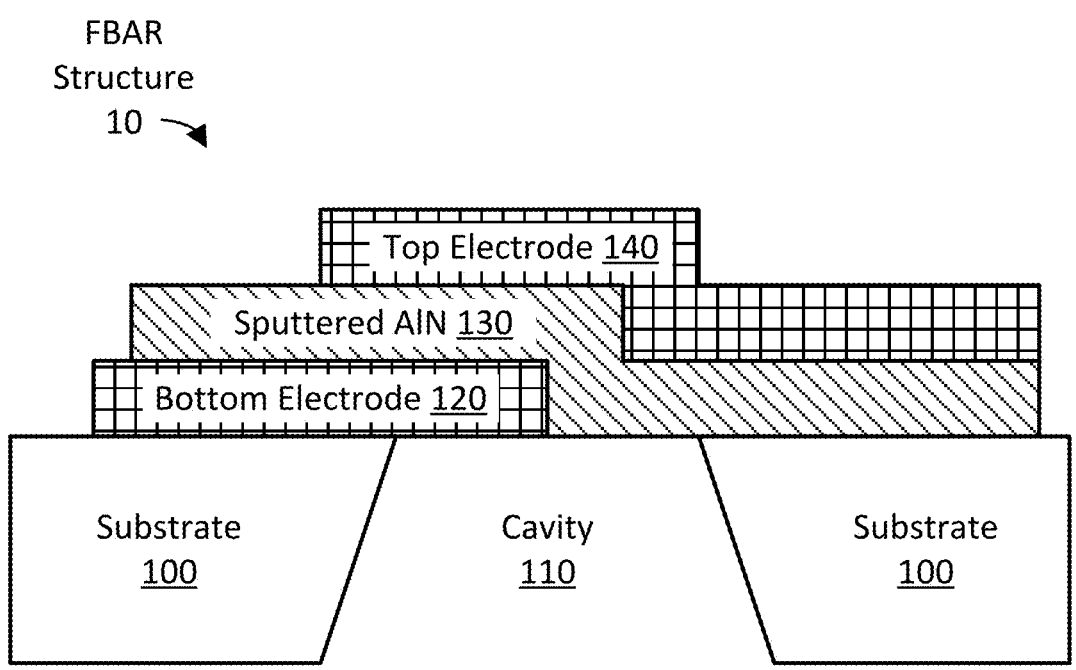
FIG. 1 illustrates an example film bulk acoustic resonator (FBAR) structure formed with a sputtered aluminum nitride (AlN) piezoelectric element.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. In short, the figures are provided merely to show example structures.

DETAILED DESCRIPTION

Techniques are disclosed for forming high frequency film bulk acoustic resonator (FBAR) devices using epitaxially grown piezoelectric films. In some cases, the piezoelectric layer of the FBAR may be an epitaxial III-V layer such as an aluminum nitride (AlN) or other group III material-nitride (III-N) compound film (e.g., any combination of one or more of gallium, indium, and aluminum with nitrogen) grown as a part of a III-V material stack, although any other suitable piezoelectric materials can be used. Use of an epitaxial piezoelectric layer in an FBAR device provides numerous benefits, such as being able to achieve films that are thinner (e.g., less than 1 micron thick) and higher quality (e.g., X-ray rocking curve FWHM of 1 degree or less) compared to sputtered films, for example. The higher quality piezoelectric film results in higher piezoelectric coupling coefficients, which leads to higher Q-factor of radio frequency (RF) filters including such FBAR devices. Therefore, the FBAR devices can be included in RF filters to enable filtering high frequencies of greater than 3 GHz, which can be used for 5G wireless standards, for example. Numerous variations and configurations will be apparent in light of this disclosure.

General Overview

RF filters continue to be a major factor in the costs of RF front end and the total integrated circuit (IC) area available, particularly in light of 5G mobile telecommunication technology on the horizon. Aluminum nitride (AlN) has been a common piezoelectric film material for FBARs in the RF filter space. However, due to processing constraints, AlN is deposited via a sputtering technique after back electrode processing. As will be appreciated in light of this disclosure, sputtered AlN is of significantly poorer quality compared to AlN that is deposited via epitaxial techniques, such as, for example, metal-organic chemical vapor deposition (MOCVD) and molecular-beam epitaxy (MBE). Generally, sputtered AlN films have poor crystallinity quality, measured as the X-ray rocking curve full width at half maximum (FWHM), of FWHM greater than 1.5 degrees for thin films (e.g., films less than 1 micron in thickness). A smaller X-ray rocking curve FWHM value is desirable in piezoelectric layers of FBAR devices, as the smaller FWHM value leads to a higher crystallographic quality and thus a higher piezoelectric coupling coefficient, which leads to RF filters including such FBAR devices having desirable higher quality-factors (Q-factors). For example, sputtered AlN films of 2 microns in thickness have crystallinity characterized by X-ray diffraction (XRD) to have an X-ray rocking curve FWHM (002) of 2 degrees. In comparison, epitaxial AlN films can achieve thicknesses of 500 nm or smaller (e.g., 200 nm) including crystallinity characterized by XRD to have an X-ray rocking curve FWHM (002) of 0.4 degrees or smaller. Such an improved film quality can be obtained despite epitaxial growth from, for example, a 41 percent-lattice mismatched silicon (Si) substrate. In the RF filter space, thin films of less than 1 micron in thickness (and in some instances, less than 500 nm) may be particularly useful for communication bands at 3 GHz or higher, which are targeted for 5G wireless standards.

Epitaxial techniques of depositing AlN are not currently used for FBAR piezoelectric film applications because of the need for an initial crystalline substrate that serves as an ordered template for epitaxial growth of the AlN material film. Due to the need for a back or bottom electrode in the FBAR structure, commonly used fabrication techniques are not able to produce such suitably ordered templates for the epitaxial deposition of the AlN film. For example, FIG. 1 illustrates an example FBAR structure 10 formed with a sputtered AlN piezoelectric element 130. As shown, FBAR structure 10 includes a top electrode 140 above sputtered AlN 130 and a bottom electrode 120 below the sputtered AlN layer 130. The sputtered AlN piezoelectric element 130 and electrodes 120 and 140 are suspended over a cavity 110 in substrate 100. Such a structure allows the FBAR 10 to resonate mechanically in response to an electric signal applied between the electrodes 120 and 140. However, using sputtered AlN as the piezoelectric element has film quality and frequency limitations, as previously described.

Thus, and in accordance with one or more embodiments of the present disclosure, techniques are provided for forming high frequency FBAR devices using epitaxially grown piezoelectric elements. In some embodiments, the FBAR devices may be used in RF filters or for other suitable applications, such as for duplexers, for multiplexers, for sensors, in conjunction with power amplifiers (PAs), or for low noise amplifiers (LNAs), for example. In some embodiments, the piezoelectric element of the FBAR structure may be epitaxial AlN or any other suitable epitaxial piezoelectric material, such as zinc oxide (ZnO) or lead zirconium titanate (PZT), or other III-V compounds, such as gallium nitride (GaN), indium nitride (InN), or other III-N materials, for example, as will be apparent in light of the present disclosure. As variously used herein, III-V compounds/materials include at least one group III element (e.g., aluminum, gallium, indium, boron, thallium) and at least one group V element (e.g., nitrogen, phosphorus, arsenic, antimony, bismuth). In some embodiments, group III element-nitride (III-N) compounds/materials may be particularly well-suited for the FBAR piezoelectric element, due to III-N materials having high bandgaps and other desirable properties. III-N materials, as variously used herein, include a compound of one or more group III materials (e.g., aluminum, gallium, and/or indium), with nitrogen. Accordingly, III-N materials/compounds as variously used herein include, but are not limited to, GaN, InN, AlN, AlInN, AlGaN, InGaN, and AlInGaN.

In some embodiments, the use of an epitaxially grown piezoelectric film for an FBAR device can result in thinner films and improved film quality, as previously described. For example, a higher quality piezoelectric film (e.g., epitaxial AlN) results in higher piezoelectric coupling coefficients (e.g., as compared to sputtered AlN), which leads to higher Q-factor of RF filters including FBAR devices formed using the techniques variously described herein. Higher Q-factor is desirable for RF filters as it reduces signal losses and increases the ability of the filter to reject out-of-band signals, for example. Further, FBAR structures including a thin piezoelectric layer, such as less than 1 micron in thickness, may be used to implement high frequency RF filters such as those used for communication bands of 3 GHz or higher. Accordingly, the techniques variously described herein can be used to achieve such FBAR structures having a sufficiently thin and high quality piezoelectric layer, thereby enabling high frequency RF filters, such as for 5G wireless standards. Note that although the FBAR structures variously described herein are primarily discussed in the context of being used with high frequency RF filters, such FBAR structures are not intended to be so limited and may be used in any number of applications as will be appreciated in light of this disclosure.

In some embodiments, the techniques for forming FBAR structures having an epitaxial piezoelectric film include initially growing a stack of materials on a substrate by an epitaxial method such as MOCVD, MBE, or any other suitable epitaxial growth process. In some such embodiments, the stack can include various III-V materials epitaxially grown on a group IV material substrate (e.g., a silicon (Si), silicon carbide (SiC), germanium (Ge), or SiGe substrate), a sapphire substrate, or any other suitable material substrate. For example, in one specific embodiment the III-V material stack may include a nucleation layer, an n-type doped gallium nitride (GaN) or indium gallium nitride (InGaN) layer, an epitaxially grown AlN piezoelectric layer, and other III-V layers, such as a buffer layer and a polarization layer, as will be described in more detail herein. In some such embodiments, the III-V material stack can be used to form an FBAR structure by etching away the polarization and buffer layer in the area to be used for the FBAR structure, forming a top electrode, depositing interlayer dielectric (ILD) over the top electrode, forming vias and top interconnects in the ILD, etching the ILD above the top electrode to form a top cavity, forming a via behind or in front of the stack to etch out substrate material underneath the FBAR structure to form a bottom cavity, and forming a bottom electrode (e.g., via backside metallization using an atomic layer deposition (ALD) process). Further, in some such embodiments, the top interconnect formed to electrically contact the bottom electrode may physically contact to the bottom electrode metal material or the interconnect may only penetrate to the n-type doped InGaN/GaN layer, such that it does not physically contact the bottom electrode and forms an acoustic mirror, for example. In some embodiments, the top and/or bottom electrodes may include multiple layers of metal with ILD material sandwiched between metal layers, which can act as a reflector for acoustic waves, for example.

Use of the techniques and structures provided herein may be detectable using tools such as scanning/transmission electron microscopy (SEM/TEM), composition mapping, x-ray crystallography or diffraction (XRD), secondary ion mass spectrometry (SIMS), time-of-flight SIMS (ToF-SIMS), atom probe imaging, local electrode atom probe (LEAP) techniques, 3D tomography, high resolution physical or chemical analysis, to name a few suitable example analytical tools. In particular, such tools may indicate a structure or device configured with an FBAR structure including an epitaxial piezoelectric film as variously described herein. For example, in some embodiments, an epitaxial AlN piezoelectric film may be detected between a top and bottom electrode of an FBAR structure. In some such embodiments, the thickness and/or film quality of the FBAR piezoelectric layer may be indicative that the techniques variously described herein have been used. For example, use of the techniques variously described herein can result in an FBAR including a piezoelectric film (e.g., epitaxial AlN) having a maximum thickness of 1 micron, 500 nm, 200 nm, 100 nm, 50 nm, or some other suitable maximum thickness as will be apparent in light of the present disclosure.

Likewise, use of the techniques variously described herein can result in an FBAR including a piezoelectric film (e.g., epitaxial AlN) having crystallinity characterized by an X-ray rocking curve FWHM of less than 2 degrees, 1.5 degrees, 1 degree, 0.5 degrees, or some other suitable maximum as will be apparent in light of the present disclosure. As previously described, a smaller X-ray rocking curve FWHM value is desirable in piezoelectric layers of FBAR devices, as it leads to a higher crystallographic quality and thus a higher piezoelectric coupling coefficient, which leads to RF filters including such FBAR devices having desirable higher Q-factors. Therefore, the techniques variously described herein can be used to form higher quality FBAR structures and thus higher quality RF filters, even when the RF filters are used to filter high frequencies (e.g., 3 GHz or greater). Further, the techniques variously described herein may be detected through the high frequency filter or communication band capabilities achieved. For example, the techniques variously described herein can be used to form an FBAR RF filter having high frequency filter capabilities of 3 GHz or greater and/or 5G or greater wireless standard capabilities. Further, such RF filters may be used, for example, for RF front end applications of mobile computing devices (e.g., mobile/smart phones or tablet computing devices). Further still, such higher performing RF filters may provide lower losses and higher signal integrity for any electronic device including wireless communication capabilities. Numerous benefits, configurations, and variations will be apparent in light of this disclosure.

Architecture and Methodology

FIGS. 2A-H illustrate example integrated circuit structures used to form an FBAR device including an epitaxial piezoelectric layer, in accordance with some embodiments of the present disclosure. More specifically, FIGS. 2A-H illustrate the process flow and structures involved in the fabrication of an FBAR including an epitaxially grown AlN piezoelectric film, in accordance with various embodiments. Note that although the piezoelectric element is primarily described herein in the context of an epitaxially grown AlN film, the present disclosure is not so limited. As will be apparent in light of the present disclosure, in some embodiments, the processing techniques variously described herein are applicable to forming FBARs including other piezoelectric materials, such as ZnO or PZT, or other III-V compounds such as GaN or indium nitride InN, for example, or any other suitable piezoelectric material, depending on the end use or target application. Therefore, the techniques variously described herein can be used to form various FBAR structures including higher quality piezoelectric film, resulting in higher piezoelectric coupling coefficients, which leads to higher Q-factor for RF filters that include such FBAR structures.

Figure 2A:
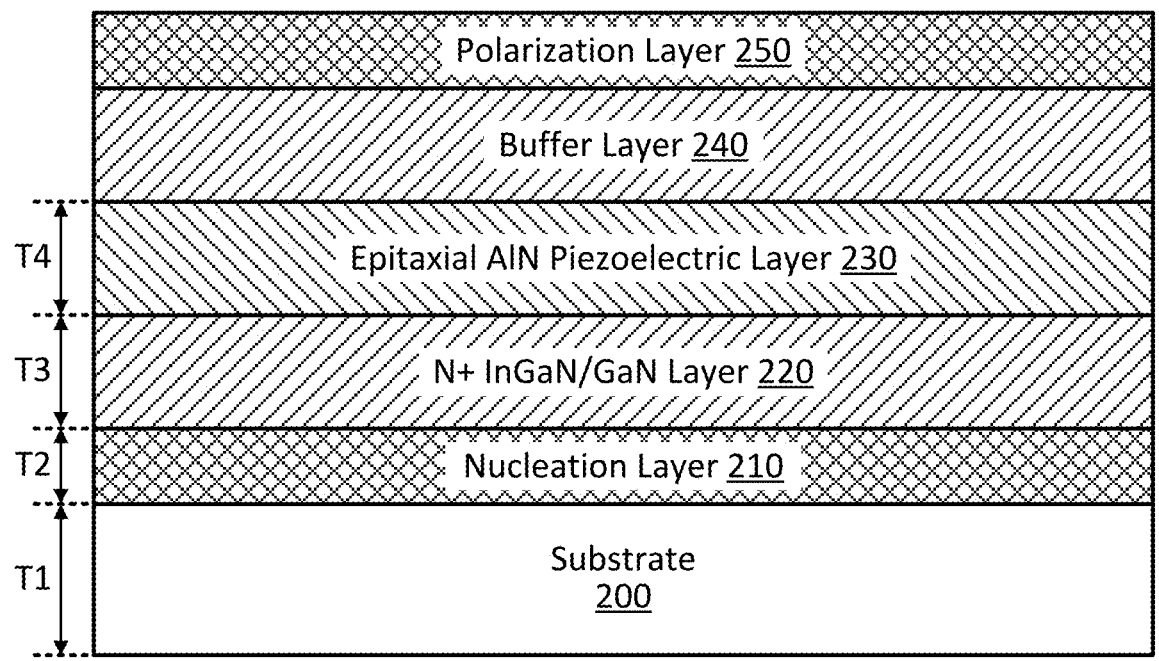
FIGS. 2A-H illustrate example integrated circuit structures used to form an FBAR device including an epitaxial AlN piezoelectric layer, in accordance with an embodiment of the present disclosure. Note that although AlN is used as an example piezoelectric layer material, the present disclosure is not intended to be so limited. For example, in some embodiments, the epitaxial piezoelectric layer material may include other group III material-nitride (III-N) compounds (e.g., any combination of one or more of gallium, indium, and aluminum with nitrogen).

FIG. 2A illustrates a stack of III-V materials formed on substrate 200, in accordance with an example embodiment. In this example embodiment, the stack layers 210, 220, 230, 240, and 250 were formed on substrate 200 via epitaxial growth using, for example, MOCVD and/or MBE processes. However, in some embodiments, the layers may be grown or deposited using one or more other suitable processes. In some embodiments, substrate 200 may be a bulk substrate of one or more group IV materials, such as a bulk Si, Ge, SiC, or SiGe substrate, or substrate 200 may be a sapphire substrate, or substrate 200 may include any other suitable material, depending on the end use or target application. In some embodiments, substrate 200 may be an X on insulator (XOI) structure where X comprises Si, Ge, SiC, SiGe, or sapphire, and the insulator material is an oxide material or dielectric material or some other electrically insulating material or some other suitable multilayer structure where the top layer comprises Si, Ge, SiC, SiGe, or sapphire. Although substrate 200 is illustrated in FIG. 2A as having a similar thickness as the other layers 210, 220, 230, 240, and 250, in some instances substrate 200 may be much thicker than those other layers, such as on the order of at least 10, 100, or 1000 times thicker than those layers. For example, where substrate 200 is a bulk substrate, it may have a thickness T1 in the range of 100 to 950 microns. In some embodiments, substrate 200 may be used for one or more other integrated circuit (IC) devices, such as various diodes (e.g., light-emitting diodes (LEDs) or laser diodes), various transistors (e.g., metal-oxide-semiconductor field-effect transistors (MOSFETs) or tunnel FETs (TFETs)), various microelectromechanical systems (MEMS), various nanoelectromechanical systems (NEMS), various sensors, or any other suitable semiconductor or IC devices, depending on the end use or target application. Accordingly, in some embodiments, the FBAR structures may be included in various system-on-chip (SoC) applications, as will be apparent in light of the present disclosure.

Continuing with the example structure of FIG. 2A, nucleation layer 210 is formed above and on substrate 200. In some embodiments, the nucleation layer 210 may be formed to prevent subsequent layers (e.g., layer 220) from reacting with the substrate material. For example, where substrate 200 is a bulk Si substrate and layer 220 is n-type doped InGaN and/or GaN, nucleation layer 210 may be deposited prior to deposition of layer 220 to prevent layer 220 from directly contacting the Si substrate. Thus, in some such embodiments, the material, thickness, and deposition conditions may be dictated by the characteristics of substrate 200 and/or layer 220. In some embodiments, nucleation layer may not be needed, as layer 220 may be compatible with substrate 200, such that layer 220 material can be deposited or grown directly on the material of substrate 200. Accordingly, in some embodiments, nucleation layer 210 may be optional. In some embodiments, the nucleation layer may be a III-V material, such as AlN or a low temperature GaN layer (e.g., epitaxially grown at a temperature in the range of 700 to 950 degrees Celsius), for example. In some embodiments, where present, the nucleation layer 210 may have a thickness T2 of 0.05 to 1 micron (e.g., 50 to 200 nm), less than 50 nm (e.g., approximately 20 nm), or any other suitable thickness depending on the end use or target application.

Continuing with the example structure of FIG. 2A, n-type doped InGaN/GaN layer 220 is formed above and on nucleation layer 210. In some embodiments, layer 220 may be formed to provide a suitably ordered template for subsequent epitaxial growth of the piezoelectric film material layer 230, such that layer 230 will be able to achieve desired properties (e.g., desired crystalline quality, desired thickness or desired piezoelectric coupling coefficient). Thus, in some such embodiments, the material, thickness, and deposition conditions of layer 220 may be dictated by the characteristics of piezoelectric layer 230 (and/or substrate 200 and/or nucleation layer 210). For example, in the case of a Si substrate 200 and an epitaxial AlN piezoelectric layer 230, an n-type doped InGaN/GaN layer 220 can help with improved film quality of piezoelectric layer 230 despite epitaxial growth from, e.g., a 30-50%-lattice mismatched Si substrate. In some embodiments, layer 220 may be formed as a piezoresistive element that may or may not include multiple layers. In embodiments where layer 220 is an n-type doped InGaN and/or GaN layer, the layer may be a single layer of n-type doped InGaN or n-type doped GaN, where the n-type dopant may be Si, oxygen or any other suitable material, and such doping may be greater than 1E20 per cubic cm, or any other suitable amount, depending on the end use or target application. In some embodiments, layer 220 may include both InGaN and GaN, where the epitaxial growth of the layer includes depositing GaN and grading In material in and/or out during the deposition of the layer. Thus, in some embodiments, layer 220 may appear as a single layer of substantially homogenous material consistency (e.g., less than 5% variation in material throughout the layer), a single graded layer including a change in material consistency (e.g., areas of greater or lesser In content relative to the rest of the layer), or multiple layers (e.g., at least one layer of GaN that is substantially discrete from at least one layer of InGaN in the multi-layer structure). In some embodiments, layer 220 may have a thickness T3 of 0.05 to 2 microns, or any other suitable thickness depending on the end use or target application.

Continuing with the example structure of FIG. 2A, epitaxial AlN piezoelectric film layer 230 is formed above and on layer 220. In this example embodiment, the piezoelectric layer 230 is an epitaxially grown AlN film layer. However, as described herein, the present disclosure is not intended to be so limited. For example, in other embodiments, the piezoelectric element layer may include other III-V compounds such as gallium nitride (GaN), indium nitride (InN) or other III-N materials. In some embodiments, the piezoelectric element layer may include zinc oxide (ZnO) or lead zirconium titanate (PZT), or any other suitable material layer depending on the end use or target application. In some embodiments the piezoelectric layer 230 may have a thickness T4 of 0.05 to 1 micron (e.g., less than 0.5 microns), less than 500 nm, or any other suitable thickness depending on the end use or target application. In some such embodiments, piezoelectric layer 230 may be characterized by its maximum thickness, which may be the greatest measurable thickness of the layer in the FBAR structure, for example. In embodiments where the FBAR structure being formed is to be used in an RF filter, the thickness of piezoelectric film layer 230 may be dictated or selected based on the desired frequencies to be filtered by the RF filter device. For example, a thinner piezoelectric film layer 230 may be used for higher frequency filters (e.g., for filtering frequencies greater than 1, 2, 3, 4, or 5 GHz). In embodiments where piezoelectric film layer is epitaxially grown AlN, the film layer can be grown in a high quality manner, with the ability to achieve an X-ray rocking curve FWHM of less than 2 degrees, 1.5 degrees, 1 degree, or 0.5 degrees, depending on the characteristics of the film layer 230 (e.g., film thickness or deposition conditions).

Continuing with the example structure of FIG. 2A, buffer layer 240 is formed above and on piezoelectric layer 230. In this example embodiment, buffer layer may include any suitable III-V material, such as GaN or any other suitable material depending on the end use or target application. In addition, in the example structure of FIG. 2A, polarization layer 250 is formed above and on buffer layer 240. In this example embodiment, polarization layer may include any suitable III-V material, such as AlN, AlGaN, AlInN, AlInGaN, or any other suitable material, depending on the end use or target application. In some embodiments, layers 240 and 250 may be included in the III-V stack formed on substrate 200 to help protect piezoelectric layer 250 during other fabrication processes, for example. In some embodiments, layers 240 and 250 may be included in the III-V stack formed on substrate 200 for use with other devices formed on substrate 200. Thus, layers 240 and 250 may be included as part of a standard device structure and such layers 240 and 250 may not be needed in the formation of the FBAR structure, in some embodiments.

Figure 2B:
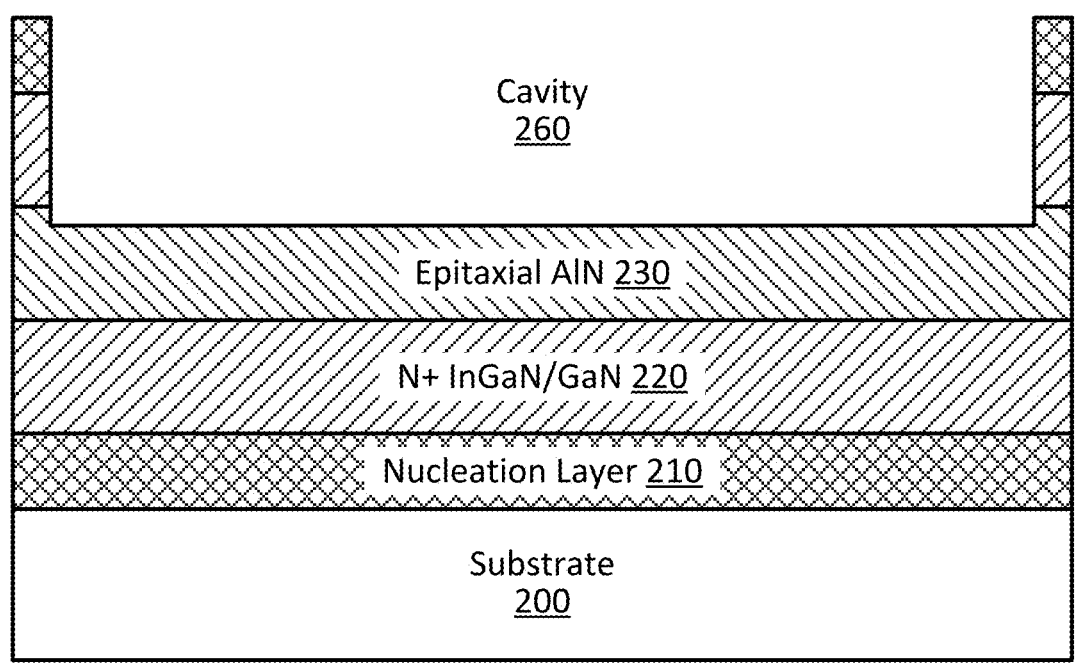
Figure 2C:
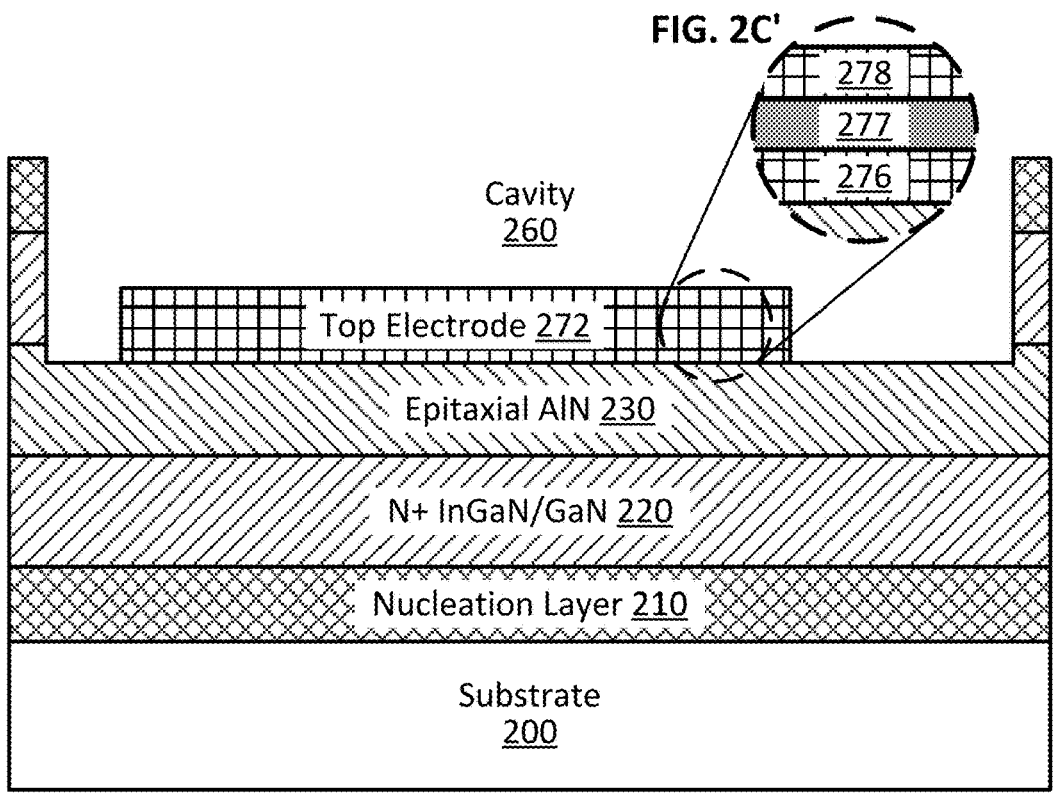

FIG. 2B illustrates an example resulting structure formed by etching polarization layer 250 and buffer layer 240 of the structure of FIG. 2A to form cavity 260, in accordance with an example embodiment. Formation of cavity 260, in this example embodiment, may include any suitable etch process or processes. Note that cavity 260 may be formed to have any desired width, depending on the end use or target application. Also not that although cavity 260 extends into piezoelectric layer 230 in this example embodiment, the present disclosure is not intended to be so limited. In some embodiments, cavity 260 may not extend into layer 230 or it may extend farther into layer 230, depending on the etching process used, for example. FIG. 2C illustrates an example resulting structure formed by depositing and patterning top electrode 272 in cavity 260 of the structure of FIG. 2B. As can also be seen, top electrode 272 is formed above and on the epitaxial AlN piezoelectric layer 230. Formation of top electrode 272 may include any suitable deposition and patterning processes, such as an atomic layer deposition (ALD) process, for example. In some embodiments, top electrode 272 may be formed from any suitable material, such as one or more hard metals (e.g., tungsten or molybdenum). In some embodiments, top electrode 272 may include a multi-layer structure. In some such embodiments, top electrode 272 may include multiple layers of metal material and interlayer dielectric (ILD) material, such as in a metal/ILD/metal format, a metal/ILD/metal/ILD/metal format, and so on. For example, FIG. 2C' illustrates a multi-layer top electrode including a bottom metal layer 276, a top metal layer 278, and an ILD layer 277 sandwiched between the metal layers 276 and 278. The metal in the multi-layer electrode may include any suitable metal, such as tungsten or molybdenum, for example, and the ILD material may include any suitable insulating material, such as silicon dioxide, silicon nitride, or any suitable low-k dielectric material, for example. Such multi-layer electrode structures may be used to act as a reflector for acoustic waves, for example.

Figure 2D:
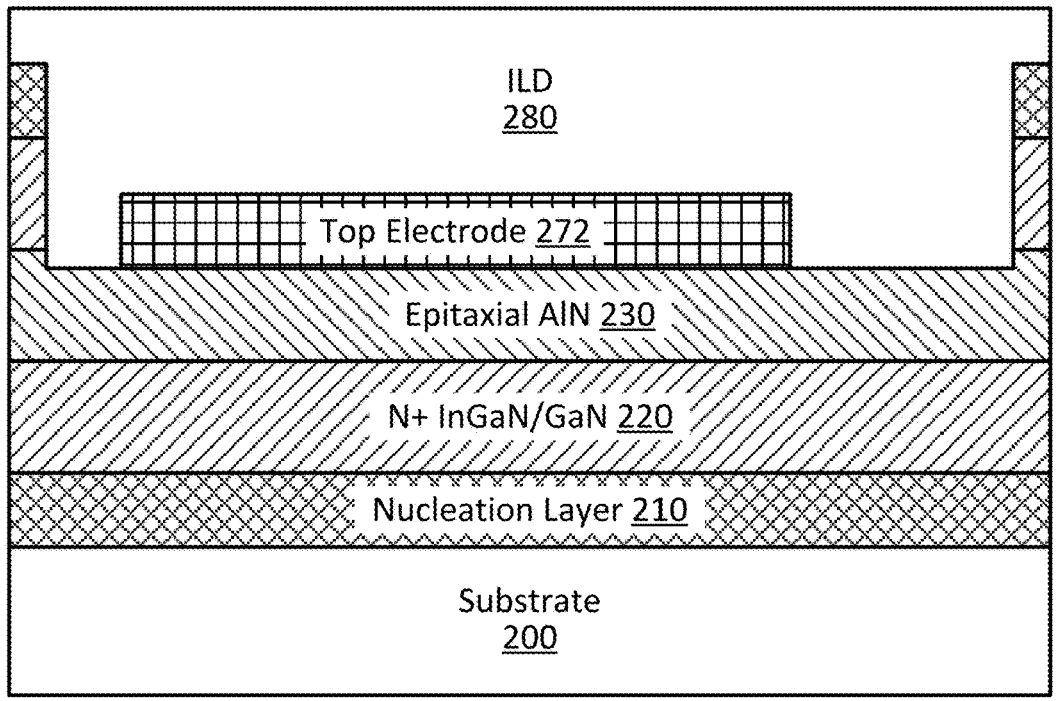
Figure 2E:
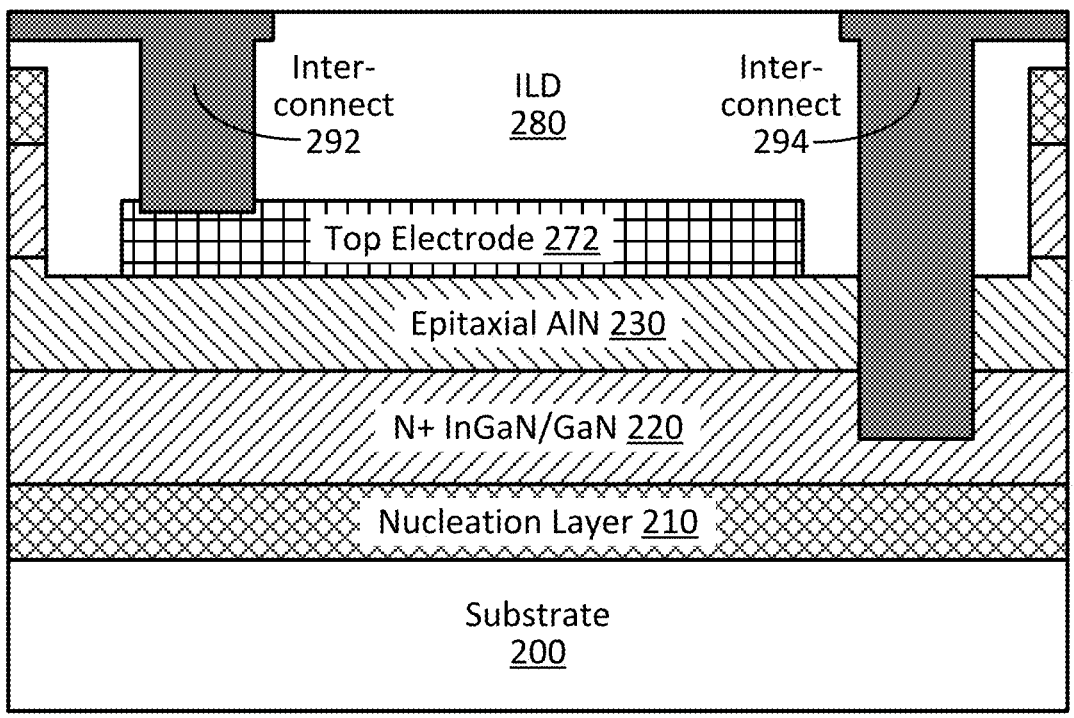

FIG. 2D illustrates an example resulting structure formed by filling cavity 260 of the structure of FIG. 2C with ILD material 280, in accordance with an example embodiment. Filling with ILD 280 material, in this example embodiment, may include any suitable deposition and planarization processes. FIG. 2E illustrates an example resulting structure formed after etching vias in the structure of FIG. 2D and filling the vias by depositing interconnect material to form interconnects 292 and 294. In some embodiments, interconnects 292 and 294 may be formed from any suitable material, such as one or more soft metals (e.g., copper or gold). As can be seen in FIG. 2E, interconnect 292 is both physically and electrically in contact with top electrode 272. As can also be seen, interconnect 294 extends through epitaxial AlN layer 230 down to layer 220, in this example embodiment. Interconnect 294 will be described in more detail below.

Figure 2F:
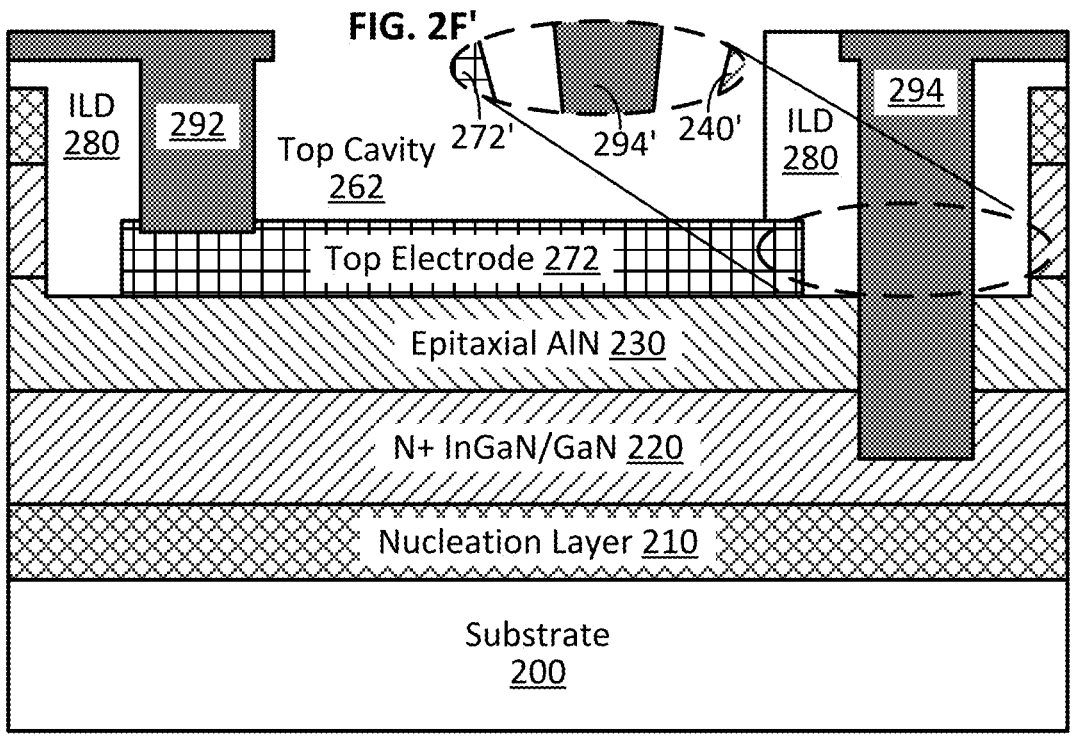

FIG. 2F illustrates an example resulting structure after top cavity 262 is formed in the ILD 280 of the structure of FIG. 2E, in accordance with an example embodiment. Formation of cavity 262, in this example embodiment, may include any suitable etch process or processes. Note that top cavity 262 extends over a majority of top electrode 272 and that top cavity 262 may have any suitable width, depending on the end use or target application. As previously described, the figures generally indicate straight lines, right angles, and smooth surfaces. However, actual real-world structures may include varying topography as desired and/or as a result of the fabrication processes used. For example, FIG. 2F' illustrates alternative topography of the structure of FIG. 2F, in accordance with some embodiments. As shown, sections 272', 294', and 240' correspond to top electrode 272, right interconnect 294, and buffer layer 240, respectively, to illustrate that the surface of those features may be slanted or otherwise non-linear, for example, in some embodiments. More specifically in the example embodiment shown in FIG. 2F', alternative buffer layer portion 240' may be sloped as a result of the etch process used to form cavity 260, alternative top electrode portion 272' may be sloped as a result of the growth/deposition process used to form top electrode 270, and interconnect portion 294' may be sloped as a result of the etch process used to form the interconnect trench for interconnect 294. Note that similar, mirror versions of the sloped portions may exist on the opposing side of the layers, in some embodiments, such as the left side of top electrode 272 may include a similar, mirror version of the slope shown in portion 272'. Further, in this example embodiment, the slope of portion 272' may be approximately parallel (e.g., within 1, 2, 5, 10, or 15 degrees of being exactly parallel) with the slope of the left side of portion 294' and the slope of portion 240' may be approximately parallel (e.g., within 1, 2, 5, 10, or 15 degrees of being exactly parallel) with the slope of the right side of portion 294'. Numerous variations on the topography of the real-world structure will be apparent in light of the present disclosure.

Figure 2G:
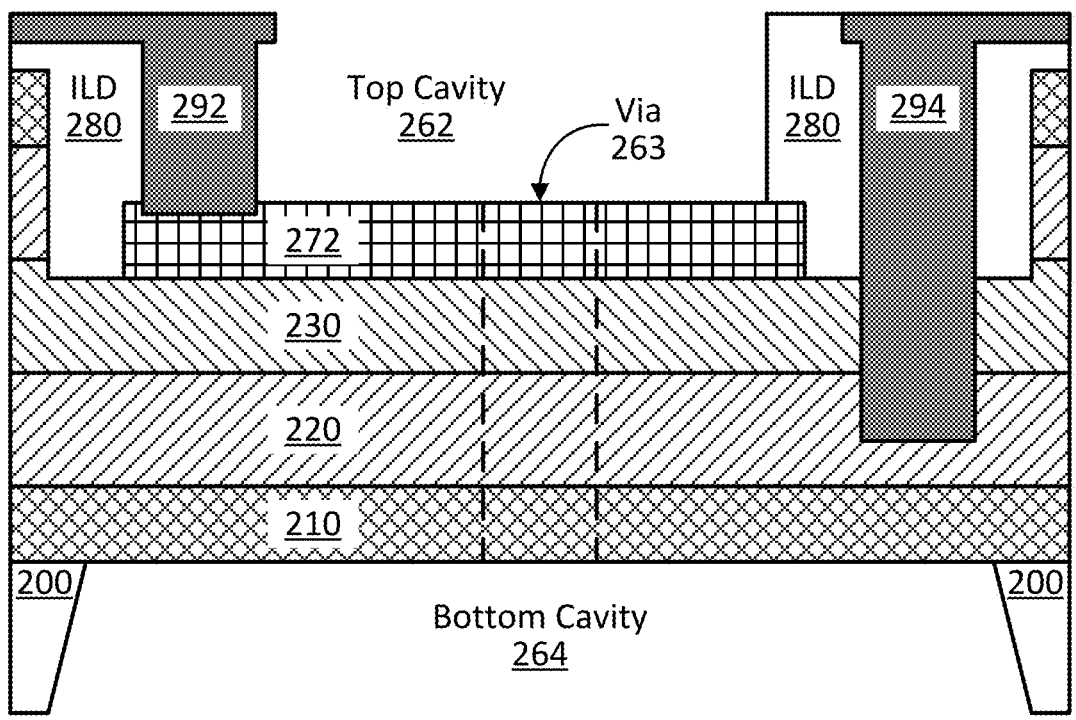

FIG. 2G illustrates an example resulting structure formed by etching via 263 through layers 230, 220, and 210 (shown with dotted line) and then etching out bottom cavity 264 from substrate 200 of the structure of FIG. 2F, in accordance with an example embodiment. Etching via 263, in this example embodiment, may include any suitable etch process or processes. As can be seen in FIG. 2G, via 263 is formed through layers 230, 220, and 210 (and may also be formed in substrate 200) to gain access to substrate 200 to flow in wet etchant and remove the substrate material underneath the III-V stack used for the resonator structure. Thus, via 263 may be formed behind (into the page) the area intended for the resonator structure shown in FIG. 2G or in front of (out of the page) the area intended for the resonator structure to gain access to substrate 200 to form bottom cavity 264. Etching bottom cavity 264, in this example embodiment, may include any suitable wet etch process and in some cases, may include an etchant that selectively removes substrate material relative to the III-V stack (or at least relative to the material of the base of the III-V stack, such as nucleation layer 210). For example, in the case of a Si substrate and an AlN nucleation layer, a suitable selective etchant used to form bottom cavity 264 may remove Si material at a rate of at least 5, 10, 20, 50, or 100 times faster relative to the removal of AlN material. As can be understood based on the present disclosure, cavities 262 and 264 help to acoustically isolate the FBAR device from the surrounding structure and also allow the FBAR device to vibrate and achieve acoustic resonance.

Figure 2H:
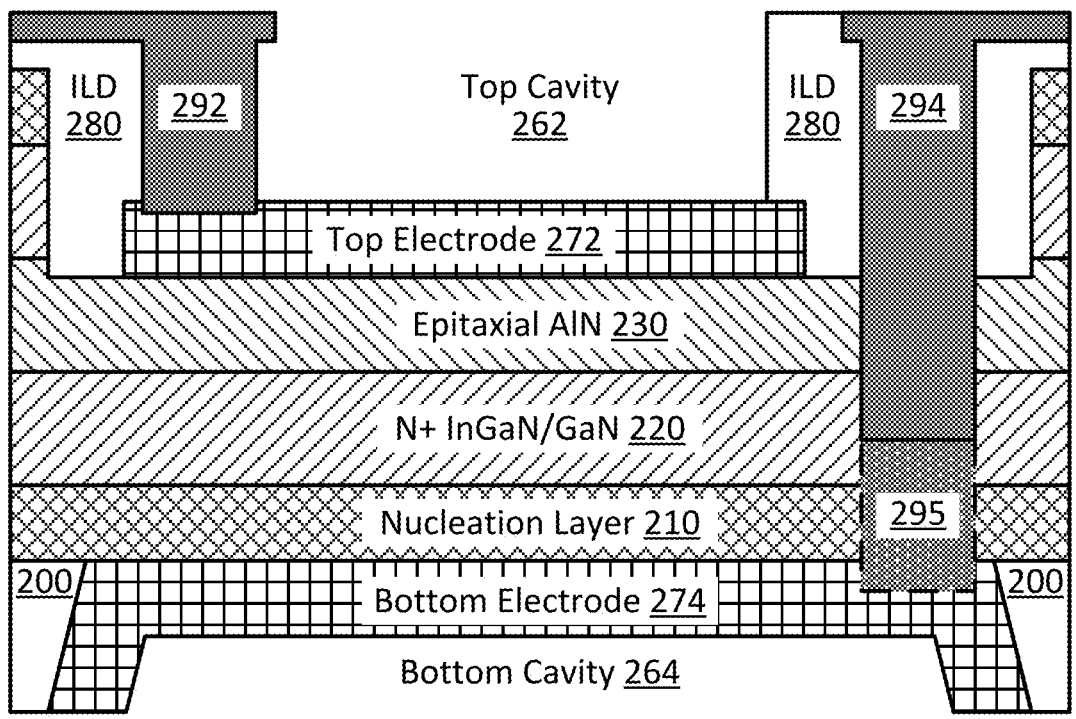

FIG. 2H illustrates an example resulting structure formed by performing a backside metallization to form bottom electrode 274 in bottom cavity 264 of the structure of FIG. 2G, in accordance with an example embodiment. Backside metallization to form bottom electrode 274, in this example embodiment, may include any suitable deposition process or processes, such as an ALD process, for example. In some cases, the entire structure may be flipped prior to performing the backside metallization. In some embodiments, bottom electrode may include multiple layers of metal material and ILD material, such as in a metal/ILD/metal format, a metal/ILD/metal/ILD/metal format, and so on. For example, the multi-layer electrode shown in FIG. 2C' may also be used for bottom electrode 274, in some embodiments, such that the bottom electrode 274 is a multi-layer electrode including a bottom metal layer 276, a top metal layer 278, and an ILD layer 277 sandwiched between the metal layers 276 and 278. Such multi-layer electrode structures may be used to act as a reflector for acoustic waves, for example. In the example embodiment of FIG. 2H, interconnect 294 only extends down to the n-type doped InGaN/GaN layer 220, such that interconnect 294 does not physically contact bottom electrode 274. In some such embodiments, the configuration can act as an acoustic mirror, for example. In some embodiments, interconnect 294 may have been formed such that it extends down into substrate 200, resulting in a final interconnect structure (after the formation of bottom cavity 264 and backside metallization to form bottom electrode 274) including both 294 and 295, for example. As can be understood, in some such embodiments, interconnect portion 295 (shown in dotted lines and having dotted shading) would be one homogenous interconnect structure with interconnect portion 294. Further, as can be seen in FIG. 2H, such an interconnect including both 294 and 295 is both physically and electrically in contact with bottom electrode 274. Numerous variations and configurations will be apparent in light of the preset disclosure.

Example System

Figure 3:
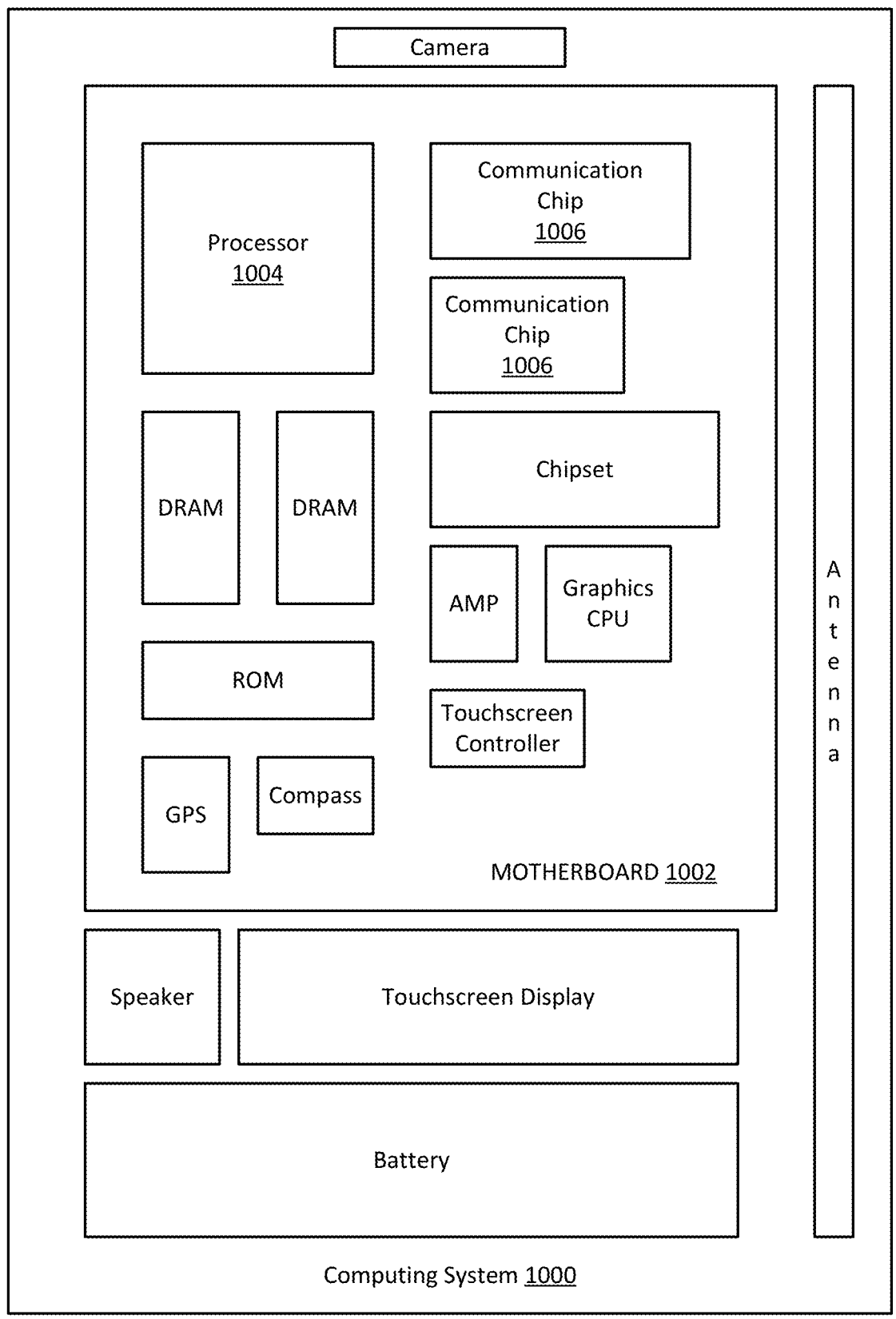
FIG. 3 illustrates a computing system implemented with integrated circuit structures or devices formed using the techniques disclosed herein, in accordance with an embodiment of the present disclosure.

FIG. 3 illustrates a computing system 1000 implemented with integrated circuit structures or devices formed using the techniques disclosed herein, in accordance with an example embodiment. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others. In some embodiments, communication chip 1006 may include one or more FBAR structures as variously described herein (e.g., FBAR including thin epitaxial AlN piezoelectric element), and such FBAR structures may be included in one or more RF filters. Further, such RF filters may be configured to be high frequency filters (e.g., operating at greater than 1, 2, 3, 4, or 5 GHz). Further still, such RF filters may be included in the RF front end of computing system 1000 and they may be used for 5G wireless standards or protocols, for example.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 is a resonator device including: a substrate; a bottom electrode over the substrate; a top electrode over the bottom electrode; and an epitaxial piezoelectric layer between the bottom and top electrode, wherein the piezoelectric layer has a maximum thickness of less than 1 micron and crystallinity characterized by an X-ray rocking curve full width at half maximum (FWHM) of less than 1.5 degrees.

Example 2 includes the subject matter of Example 1, wherein the piezoelectric layer material is a group III material-nitride (III-N) compound.

Example 3 includes the subject matter of any of Examples 1-2, wherein the piezoelectric layer material is aluminum nitride (AlN).

Example 4 includes the subject matter of Example 1-3, wherein the piezoelectric layer has a maximum thickness of less than 500 nm.

Example 5 includes the subject matter of any of Examples 1-4, wherein the piezoelectric layer crystallinity is characterized by an X-ray rocking curve FWHM of less than 1 degree.

Example 6 includes the subject matter of any of Examples 1-5, further including an n-type doped layer of at least one of indium gallium nitride (InGaN) and gallium nitride (GaN) located between the bottom electrode and the piezoelectric layer.

Example 7 includes the subject matter of any of Examples 1-6, further including a nucleation layer located between the bottom electrode and the epitaxial piezoelectric layer.

Example 8 includes the subject matter of any of Examples 1-7, wherein the substrate is a bulk silicon substrate.

Example 9 includes the subject matter of any of Examples 1-8, further including a first cavity located between the substrate and the bottom electrode, and a second cavity located above the top electrode.

Example 10 includes the subject matter of any of Examples 1-9, wherein at least one of the bottom and top electrodes includes two metal layers having an interlayer dielectric (ILD) material layer sandwiched between the two metal layers.

Example 11 includes the subject matter of any of Examples 1-10, further including interconnects, wherein a first interconnect is electrically and physically in contact with the top electrode, and wherein a second interconnect extends through the piezoelectric layer.

Example 12 includes the subject matter of Example 11, wherein the second interconnect is not in physical contact with the bottom electrode.

Example 13 includes the subject matter of Example 11, wherein the second interconnect is electrically and physically in contact with the bottom electrode.

Example 14 is a radio frequency (RF) filter device including the subject matter of any of Examples 1-13.

Example 15 includes the subject matter of Example 14, wherein the RF filter is configured to filter frequencies of greater than 3 GHz.

Example 16 is a computing system including the subject matter of any of Examples 1-15.

Example 17 is a film bulk acoustic resonator (FBAR) device including: a substrate; a bottom electrode over the substrate, wherein a cavity is located between the substrate and the bottom electrode; an n-type doped layer of at least one of indium gallium nitride (InGaN) and gallium nitride (GaN) above the bottom electrode; an epitaxial group III material-nitride (III-N) compound piezoelectric layer on the n-type doped InGaN/GaN layer; and a top electrode on the epitaxial AlN piezoelectric layer.

Example 18 includes the subject matter of Example 17, wherein the piezoelectric layer material is aluminum nitride (AlN).

Example 19 includes the subject matter of any of Examples 17-18, wherein the piezoelectric layer has at least one of a maximum thickness of less than 1 micron and crystallinity characterized by an X-ray rocking curve full width at half maximum (FWHM) of less than 1.5 degrees.

Example 20 includes the subject matter of any of Examples 17-19, wherein the piezoelectric layer has a maximum thickness of less than 500 nm.

Example 21 includes the subject matter of any of Examples 17-20, wherein the piezoelectric layer has crystallinity characterized by an X-ray rocking curve full width at half maximum (FWHM) of less than 1 degree.

Example 22 includes the subject matter of any of Examples 17-21, wherein the piezoelectric layer has a maximum thickness of less than 500 nm and crystallinity characterized by an X-ray rocking curve full width at half maximum (FWHM) of less than 1 degree.

Example 23 includes the subject matter of any of Examples 17-22, further including a nucleation layer located between the bottom electrode and the n-type doped layer of at least one of InGaN and GaN.

Example 24 includes the subject matter of any of Examples 17-23, wherein the substrate is one of a bulk silicon substrate, a bulk silicon carbide substrate, and a bulk sapphire substrate.

Example 25 includes the subject matter of any of Examples 17-24, further including another cavity above the top electrode.

Example 26 includes the subject matter of any of Examples 17-25, wherein at least one of the bottom and top electrodes includes two metal layers having an interlayer dielectric (ILD) material layer sandwiched between the two metal layers.

Example 27 includes the subject matter of any of Examples 17-26, further including interconnects, wherein a first interconnect is electrically and physically in contact with the top electrode, and wherein a second interconnect extends through the piezoelectric layer.

Example 28 includes the subject matter of Example 27, wherein the second interconnect is not in physical contact with the bottom electrode.

Example 29 includes the subject matter of Example 27, wherein the second interconnect is electrically and physically in contact with the bottom electrode.

Example 30 is a radio frequency (RF) filter device including the subject matter of any of Examples 17-29.

Example 31 includes the subject matter of Example 30, wherein frequencies filtered are greater than 3 GHz.

Example 32 is a computing system including the subject matter of any of Examples 17-31.

Example 33 is a method of forming a resonator device, the method including: providing a substrate; epitaxially growing a stack of III-V material layers on the substrate, wherein the stack of III-V material layers includes an epitaxial piezoelectric layer; forming a top electrode on the piezoelectric layer; etching a cavity between the substrate and the stack of III-V material layers; and forming a bottom electrode in the cavity.

Example 34 includes the subject matter of Example 33, wherein the piezoelectric layer material is a group III material-nitride (III-N) compound.

Example 35 includes the subject matter of any of Examples 33-34, wherein the piezoelectric layer material is aluminum nitride (AlN).

Example 36 includes the subject matter of any of Examples 33-35, wherein the substrate is a bulk silicon substrate.

Example 37 includes the subject matter of any of Examples 33-36, wherein epitaxially growing the stack of III-V material layers is performed using at least one of a metal-organic chemical vapor deposition (MOCVD) and molecular-beam epitaxy (MBE) process.

Example 38 includes the subject matter of any of Examples 33-37, wherein etching the cavity between the substrate and the stack of III-V material layers includes forming a via through the stack of III-V material layers and flowing in a wet etchant to selectively remove substrate material.

Example 39 includes the subject matter of any of Examples 33-38, wherein forming the top electrode includes an atomic layer deposition (ALD) process.

Example 40 includes the subject matter of any of Examples 33-39, wherein forming a bottom electrode in the cavity includes a backside metallization atomic layer deposition (ALD) process.

Example 41 includes the subject matter of any of Examples 33-40, further including forming an interconnect in at least a portion of the stack of III-V material layers.

Example 42 includes the subject matter of Example 41, wherein the interconnect does not extend through the entire stack.

Example 43 includes the subject matter of Example 41, wherein the interconnect extends through the entire stack and is in contact with the bottom electrode.

Example 44 includes the subject matter of any of Examples 33-43, wherein the piezoelectric layer has a maximum thickness of less than 1 micron and crystallinity characterized by an X-ray rocking curve full width at half maximum (FWHM) of less than 1.5 degrees.

Example 45 includes the subject matter of any of Examples 33-44, further including forming a radio frequency (RF) filter device.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit including at least one resonator device, the integrated circuit comprising:
    a bottom electrode including one or more metals;
    a bottom cavity below the bottom electrode;
    a top electrode above the bottom electrode, the top electrode including one or more metals;
    a top cavity above the top electrode; and
    a first layer including nitrogen and at least one of aluminum, gallium, or indium, the first layer between the bottom electrode and the top electrode, the first layer having a maximum thickness of less than 1 micron and crystallinity characterized by an X-ray rocking curve full width at half maximum (FWHM) of less than 1.5 degrees;
    a second layer between the bottom electrode and the first layer, the second layer compositionally different from the first layer and including gallium and nitrogen;
    a first interconnect in contact with the top electrode; and
    a second interconnect that extends through the first layer and the second layer, the second interconnect in contact with the bottom electrode.

2. The integrated circuit of claim 1, wherein the first layer consists essentially of aluminum and nitrogen.

3. The integrated circuit of claim 1, wherein the first layer has a maximum thickness of less than 500 nanometers, and wherein the bottom cavity is in direct contact with at least a section of the bottom electrode.

4. The integrated circuit of claim 1, wherein no intervening electrode is present between the first layer and the second layer.

5. The integrated circuit of claim 1, further comprising: a third layer between the bottom electrode and the second layer, the third layer including aluminum and nitrogen.

6. The integrated circuit of claim 1, wherein the first layer has a maximum thickness of less than 200 nanometers and an X-ray rocking curve FWHM of less than 0.5 degrees.

7. The integrated circuit of claim 1, wherein the bottom electrode or the top electrode, or both the bottom and top electrodes, includes a multilayer structure including a dielectric layer between two metal layers.

8. The integrated circuit of claim 1, wherein the second interconnect is not in direct contact with the bottom electrode.

9. The integrated circuit of claim 1, wherein the second interconnect includes one or more portions and is in direct contact with the bottom electrode.

10. The integrated circuit of claim 1, further comprising a radio frequency (RF) filter that includes the at least one resonator device.

11. The integrated circuit of claim 10, wherein the RF filter is configured to filter frequencies of greater than 3 GHz.

12. A computing system comprising the integrated circuit of claim 1.

13. An integrated circuit including at least one film bulk acoustic resonator (FBAR) device, the integrated circuit comprising:
    a substrate;
    a bottom electrode adjacent to the substrate;
    a cavity laterally adjacent to the bottom electrode;
    a first layer above the bottom electrode, the first layer including nitrogen and at least one of gallium or indium;
    a second layer above the first layer, the second layer including nitrogen and aluminum, wherein the second layer is compositionally different from the first layer, and wherein the second layer is directly on the first layer;
    a top electrode above the second layer;
    a first interconnect in contact with the top electrode; and
    a second interconnect that extends through the first layer and the second layer, the second interconnect in contact with the bottom electrode.

14. The integrated circuit of claim 13, wherein the at least one of aluminum, gallium, or indium included in the second layer is aluminum, and wherein the top electrode is directly on the second layer.

15. The integrated circuit of claim 13, wherein the second layer has a maximum thickness of less than 1 micron and crystallinity characterized by an X-ray rocking curve full width at half maximum (FWHM) of less than 1.5 degrees.

16. The integrated circuit of claim 13, wherein:
    the bottom electrode has (i) a top surface, (ii) one or more bottom surfaces opposite the top surface, (iii) one or more inner side surfaces between the top surface and the one or more bottom surfaces, and (iv) one or more outer side surfaces between the top surface and the one or more bottom surfaces, wherein at least one of the one or more outer side surfaces is laterally adjacent to the substrate; and
    the cavity is laterally adjacent to at least one of the one or more inner side surfaces of the bottom electrode.

17. An integrated circuit including at least one film bulk acoustic resonator (FBAR) device, the integrated circuit comprising:
    a first electrode adjacent to a cavity;
    a first layer above the first electrode, the first layer including gallium and nitrogen;
    a second layer directly above the layer, the second layer including nitrogen and aluminum, the second layer having a maximum thickness of less than 1 micron and crystallinity characterized by an X-ray rocking curve full width at half maximum (FWHM) of less than 1.5 degrees;
    a second electrode above the second layer;
    a first interconnect that extends through the first layer and the second layer, the first interconnect in contact with the first electrode; and
    a second interconnect in contact with the second electrode.

18. The integrated circuit of claim 17, wherein, the second interconnect includes one or more portions and is in direct contact with the first electrode.

19. The integrated circuit of claim 17, wherein the second layer has a maximum thickness of less than 500 nanometers.

20. The integrated circuit of claim 17, wherein the second layer has the X-ray rocking curve full width at half maximum (FWHM) of less than 1 degree.

* * * * *